(12) United States Patent
Youn et al.

(10) Patent No.: US 9,082,855 B2
(45) Date of Patent: Jul. 14, 2015

(54) THIN FILM TRANSISTOR DISPLAY PANEL AND METHOD OF MANUFACTURING THE SAME

(71) Applicant: Samsung Display Co., Ltd., Yongin, Gyeonggi-Do (KR)

(72) Inventors: Joo Ae Youn, Seongnam-si (KR); Hoon Kang, Suwon-si (KR); Sung Hoon Kim, Seoul (KR); Hye Won Yoo, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 3 days.

(21) Appl. No.: 13/858,177

(22) Filed: Apr. 8, 2013

(65) Prior Publication Data
US 2014/0131699 A1 May 15, 2014

(30) Foreign Application Priority Data

Nov. 13, 2012 (KR) .......................... 10-2012-0128140

(51) Int. Cl.
*H01L 29/10* (2006.01)
*H01L 29/786* (2006.01)
*H01L 29/66* (2006.01)

(52) U.S. Cl.
CPC .... *H01L 29/78636* (2013.01); *H01L 29/66742* (2013.01)

(58) Field of Classification Search
USPC .................................................... 257/43, 57
See application file for complete search history.

(56) References Cited

U.S. PATENT DOCUMENTS

| 6,444,505 | B1 * | 9/2002 | Chen et al. ..................... 438/149 |
| 6,952,036 | B2 | 10/2005 | Suzuki et al. |
| 6,970,221 | B1 | 11/2005 | Park et al. |
| 7,575,965 | B2 | 8/2009 | Kuwabara et al. |
| 8,071,974 | B2 | 12/2011 | Seo et al. |
| 2009/0302321 | A1 | 12/2009 | Park et al. |
| 2012/0007084 | A1 * | 1/2012 | Park et al. ...................... 257/59 |
| 2012/0161131 | A1 * | 6/2012 | Kang et al. ..................... 257/57 |
| 2014/0014950 | A1 * | 1/2014 | Hara et al. ...................... 257/43 |

FOREIGN PATENT DOCUMENTS

| JP | 06-289425 A | 10/1994 |
| JP | 10-232404 A | 9/1998 |
| JP | 2003-248240 A | 9/2003 |
| KR | 100663293 B1 | 12/2006 |
| WO | 2012090432 A1 | 7/2012 |

* cited by examiner

*Primary Examiner* — Cheung Lee
*Assistant Examiner* — Frederick B Hargrove
(74) *Attorney, Agent, or Firm* — Cantor Colburn LLP (57) ABSTRACT

A thin film transistor display panel includes a gate electrode on a substrate; a gate insulating layer on the substrate and the gate electrode; a planarization layer on the gate insulating layer and at opposing sides of the gate electrode, where the planarization layer exposes the gate insulating layer; a semiconductor layer on the gate insulating layer; and a source electrode and a drain electrode on the semiconductor layer and spaced apart from each other.

9 Claims, 7 Drawing Sheets

THIN FILM TRANSISTOR DISPLAY PANEL AND METHOD OF MANUFACTURING THE SAME

This application claims priority to Korean Patent Application No. 10-2012-0128140 filed on Nov. 13, 2012, and all the benefits accruing therefrom under 35 U.S.C. §119, the entire contents of which are incorporated herein by reference.

BACKGROUND (a) Field

The invention relates to a thin film transistor display panel and a method of manufacturing the same, and more particularly, to a thin film transistor display panel and a method of manufacturing the same capable of stably forming a planarization layer on low resistance wiring.

(b) Description of the Related Art

In general, a thin film transistor ("TFT") is used as a switching element for independently driving a pixel in a flat display panel such as a liquid crystal display or an organic light emitting display. In the flat panel display, a TFT display panel including the TFT also includes a pixel electrode which is connected to the TFT, a gate line for transmitting a gate signal to the TFT, and a data line for transmitting a data signal.

The TFT includes a gate electrode connected to the gate line to receive a gate signal, a semiconductor layer disposed on the gate electrode, a source electrode disposed on the semiconductor layer and connected to the data line to receive a data signal, and a drain electrode disposed spaced apart from the source electrode and connected to the pixel electrode. The gate line, the gate electrode, the data line, the source electrode, the drain electrode or the like are considered a metal wiring.

Research has been made in the direction of increasing a degree of pixel integration per unit area in the TFT display panel in order to increase resolution, and research is being conducted on a method of using an oxide semiconductor, which has high electron mobility, or low resistance copper wiring in order to process an image signal at a high speed.

The metal wiring may have a relatively narrow width and a relatively large thickness in order to implement a display device including the TFT display panel and having high resolution by using low resistance copper wiring. When a thickness of the metal wiring is relatively large, this large-thickness wiring and another wiring disposed thereon may undesirably become disconnected from each other.

SUMMARY

One or more exemplary embodiment of the invention provides a thin film transistor display panel, and a method of manufacturing the same having advantages of being capable of reducing or effectively preventing disconnection of a wiring disposed on a low resistance wiring.

Further, one or more exemplary embodiment of the invention provides a thin film transistor display panel, and a method of manufacturing the same having advantages of being capable of stably forming a planarization layer that reduces or effectively prevents disconnection of the wiring disposed on the low resistance wiring.

An exemplary embodiment of the invention provides a thin film transistor display panel, including: a gate electrode on a substrate; a gate insulating layer on the substrate and the gate electrode; a planarization layer on the gate insulating layer and at opposing sides of the gate electrode; a semiconductor layer on the gate insulating layer; and a source electrode and a drain electrode on the semiconductor layer and spaced apart from each other.

The planarization layer at the opposing sides of the gate electrode may expose the gate insulating layer.

The gate insulating layer may be on a whole surface of the substrate, and a portion of the gate insulating layer may be directly on the substrate.

The gate electrode may include copper, and the gate insulating layer may include an inorganic insulation material.

The gate insulating layer may include silicon oxide.

A thickness of the gate electrode may be equal to or greater than about 0.7 micrometer (μm).

A difference between a height of the gate electrode and a height of the planarization layer taken from a common surface, may be equal to or less than about 0.5 μm.

A side surface of the gate electrode may form an angle equal to or greater than about 60° with respect to an upper surface of the substrate.

The thin film transistor display panel may further include an ohmic contact layer between the semiconductor layer and the source electrode and between the source electrode and the drain electrode, a passivation film on the semiconductor layer, the source electrode and the drain electrode, an organic film on the passivation film, a contact hole defined in the passivation film and the organic film and exposing the drain electrode, and a pixel electrode on the organic film and connected to the drain electrode through the contact hole.

A first portion of the source electrode and a first portion of the drain electrode may be directly on the gate insulating layer, and second portions of the source electrode and the drain electrode may be directly on the planarization layer.

Another exemplary embodiment of the invention provides a method of manufacturing a thin film transistor display panel, the method including: providing a gate electrode on a substrate; providing a gate insulating layer on the substrate and the gate electrode; providing a semiconductor layer on the gate insulating layer and overlapping the gate electrode; providing a planarization layer on the gate insulating layer and at opposing sides of the gate electrode, after the providing a gate insulating layer; and providing a source electrode and a drain electrode on the semiconductor layer and spaced apart from each other.

The planarization layer at the opposing sides of the gate electrode may expose the gate insulating layer.

In the providing a gate insulating layer, the gate insulating layer may be formed on a whole surface of the substrate including the gate electrode thereon, and a portion of the gate insulating layer may be formed directly on the substrate.

In the providing a gate electrode, a metal layer including copper may be formed on the substrate, and metal layer may be patterned to form the gate electrode.

The gate insulating layer may include silicon oxide.

A thickness of the gate electrode may be equal to or greater than about 0.7 μm.

A difference between a height of the gate electrode and a height of the planarization layer taken from a common surface, may be equal to or less than about 0.5 μm.

A side surface of the gate electrode may form an angle equal to or greater than about 60° with respect to an upper surface of the substrate.

The method of manufacturing a thin film transistor display panel may further include providing an ohmic contact layer on the semiconductor layer, providing a passivation film on the semiconductor layer, the source electrode and the drain electrode, providing an organic film on the passivation film, defining a contact hole in the passivation film and the organic film to expose the drain electrode, and providing a pixel electrode which is connected to the drain electrode through the contact hole, on the organic film. In the providing a source electrode and a drain electrode, the ohmic contact layer between the source electrode and the drain electrode is removed.

A first portion of the source electrode and a first portion of the drain electrode may be formed directly on the gate insulating layer, and second portions of the source electrode and the drain electrode may be formed directly on the planarization layer.

One or more exemplary embodiment of the thin film transistor display panel and the method of manufacturing the same has the following advantages.

In one or more exemplary embodiment of the thin film transistor display panel and the method of manufacturing the same according to the invention, the planarization layer is provided on the gate insulating layer after the gate insulating layer is provided on the gate electrode, and as a result, damage to the planarization layer such as from a process of forming the gate insulating layer may be reduced or effectively prevented.

Further, since the gate insulating layer includes silicon oxide, variation in refractive indices between the adjacent layers of the thin film transistor display panel may be reduced and light transmittance may be increased.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

First, an exemplary embodiment of a thin film transistor display panel according to the invention will be described below with reference to the accompanying drawings.

Figure 1:
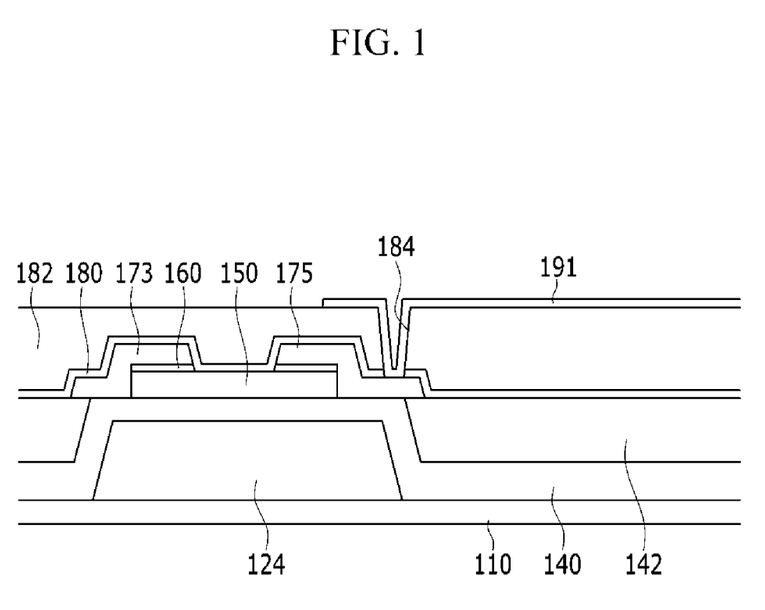
FIG. 1 is a cross-sectional view of an exemplary embodiment of a thin film transistor display panel according to the invention.

FIG. 1 is a cross-sectional view of an exemplary embodiment of a thin film transistor display panel according to the invention.

Referring to FIG. 1, the exemplary embodiment of the thin film transistor display panel according to the invention includes a gate electrode 124 disposed on a substrate 110. A gate insulating layer 140 is disposed on the substrate 110 and the gate electrode 124.

The substrate 110 may include a glass substrate and/or may include a flexible material such as plastic.

The gate electrode 124 may include a low resistance metal material such as copper (Cu), but is not limited thereto or thereby. A thickness of the gate electrode 124 taken perpendicular to the substrate 110 is relatively large. The thickness of the gate electrode 124 is equal to or greater than about 0.7 micrometer (μm) so that an electrical resistance of the wiring may be reduced. In a cross-section, a side surface of the gate electrode 124 may form an angle equal to or greater than about 60° with respect to an upper surface of the substrate 110. That is, the gate electrode 124 may have a tapered angle equal to or greater than about 60°.

The gate insulating layer 140 is disposed on substantially a whole surface of the substrate 110 including the gate electrode 124 thereon, and a portion of the gate insulating layer 140 contacts the substrate 110 to be considered directly on the substrate 110, but is not limited thereto or thereby. The gate insulating layer 140 may include an inorganic insulation material such as silicon nitride (SiNx) or silicon oxide (SiOx).

A planarization layer 142 is disposed on the gate insulating layer 140. Portions of the planarization layer 142 are positioned at both of opposing sides of the gate electrode 124. That is, the planarization layer 142 is disposed so as not overlap the gate electrode 124, which exposes the gate insulating layer 140. Thus, a cross-sectional step formed by the gate electrode 124 protruding from the substrate 110 may be removed.

The planarization layer 142 may include an organic material. An upper surface of the planarization layer 142 is level or coplanar with an upper surface of the gate insulating layer 140 disposed on the gate electrode 124. Therefore, a thickness of a portion of the thin film transistor display panel where the gate electrode 124 and the gate insulating layer 140 overlap each other is substantially equal to a thickness of a portion where the gate insulating layer 140 and the planarization layer 142 overlap each other. That is, a thickness of the planarization layer 142 may be substantially equal to a thickness of the gate electrode 124. A distance between the upper surface of the planarization layer 142 and the upper surface of the gate electrode 124 may be equal to or less than about 0.5 μm. Where a height is taken from a common reference surface, such as the upper surface of the substrate 110, a difference between a height of the planarization layer 142 and a height of the gate electrode 124 may be equal to or less than about 0.5 μm.

A semiconductor layer 150 is disposed on the gate insulating layer 140. The semiconductor layer 150 is disposed so as to overlap the gate electrode 124. As illustrated, a whole semiconductor layer 150 may overlap the gate electrode 124, but is not limited thereto or thereby. In an alternative exemplary embodiment, a portion (e.g., less than the entirety) of the semiconductor layer 150 may overlap the gate electrode 124.

The semiconductor layer 150 may include an amorphous silicon semiconductor, a polycrystalline silicon semiconductor, an oxide semiconductor or the like. Where the semiconductor layer 150 is an oxide semiconductor, the semiconductor layer 150 may include a material such as indium-gallium-zinc oxide ("IGZO"), zinc—tin oxide ("ZTO") or indium-tin oxide ("IZO").

A source electrode 173 and a drain electrode 175 are disposed spaced apart from each other on the semiconductor layer 150. A first portion of the source electrode 173 and a first portion of the drain electrode 175 overlap the semiconductor layer 150, a second portion thereof contacts the gate insulating layer 140 so as to be considered directly on the gate insulating layer 140, and a third portion thereof may contact the planarization layer 142 so as to be considered directly on the planarization layer 142. However, where the semiconductor layer 150 has a width taken parallel to the upper surface of the substrate 110 greater than that illustrated in FIG. 1, the source electrode 173 and the drain electrode 175 may not contact the gate insulating layer 140. The source electrode 173 and the drain electrode 175 may include a low resistance metal material.

An ohmic contact layer 160 may be disposed between the semiconductor layer 150 and the source electrode 173, and between semiconductor layer 150 and the drain electrode 175, where the source electrode 173 and the drain electrode 175 overlap the semiconductor layer 150. The ohmic contact layer 160 is disposed on both of opposing portions of the upper surface of the semiconductor layer 150, to expose a portion of the semiconductor layer 150 A channel of a thin film transistor is defined with the exposed portion of the semiconductor layer 150 which is not overlapped by the ohmic contact layer 160.

A passivation film 180 is disposed on the semiconductor layer 150, the source electrode 173 and the drain electrode 175. The passivation film 180 may also be disposed on the planarization layer 142. That is, the passivation film 180 may be disposed on the whole surface of the substrate 110 including the planarization layer 142, the semiconductor layer 150, the source electrode 173 and the drain electrode 175. The passivation film 180 may include an inorganic insulation material such as silicon nitride (SiNx) or silicon oxide (SiOx).

An organic film 182 may be further disposed on the passivation film 180. The organic film 182 may include an organic insulation material.

A contact hole 184 is defined in the passivation film 180 and the organic film 182 to expose an upper portion of the drain electrode 175.

A pixel electrode 191 is disposed on the organic film 182 and is connected to the drain electrode 175 through the contact hole 184. The pixel electrode 191 may include a transparent metal material such as indium tin oxide (ITO) or IZO.

The gate electrode 124, the semiconductor layer 150, the source electrode 173 and the drain electrode 175 form a single thin film transistor.

Although not illustrated, a gate line and a data line may be further disposed on the substrate, and the thin film transistor is connected to the gate line and the data line. The gate electrode 124 is connected to the gate line, such as being in a same layer of the thin film transistor panel as the gate line, and receives a gate signal to turn the thin film transistor on and off, respectively. The source electrode 173 is connected to the data line, such as being in same layer of the thin film transistor panel as the data line, to receive a data signal, and transmits the data signal to the pixel electrode 191 for displaying an image through the drain electrode 175 when the thin film transistor is in an ON state.

An amount of light, which comes in from a lower portion of the substrate 110 and then travels out from an upper surface of a display device including the thin film transistor display panel, is adjusted according to a size of the data signal. The luminance of the display device may be influenced by elements of the thin film transistor display panel disposed on the substrate 110. Particularly, where a plurality of layers disposed below the pixel electrode 191 has a different refractive index from each other, light transmittance may be negatively affected. Therefore, the light transmittance may be increased by the plurality of layers disposed below the pixel electrode 191 having substantially the same or similar refractive indices.

Where it has been described above that the gate insulating layer 140 includes an inorganic insulation material, in one exemplary embodiment, the gate insulating layer 140 includes silicon oxide (SiOx) among the inorganic insulation materials. Since the substrate 110 has a refractive index of about 1.5, and the organic film 182 has a refractive index of about 1.54, the gate insulating layer 140 includes silicon oxide (SiOx) having a refractive index of about 1.5 rather than silicon nitride (SiNx) having a refractive index of about 1.9.

Next, an exemplary embodiment of a method of manufacturing a thin film transistor display panel according to the invention will be described below with reference to the accompanying drawings.

FIGS. 2 to 7 are cross-sectional views illustrating an exemplary embodiment of a process of manufacturing a thin film transistor display panel according to the invention.

Figure 2:
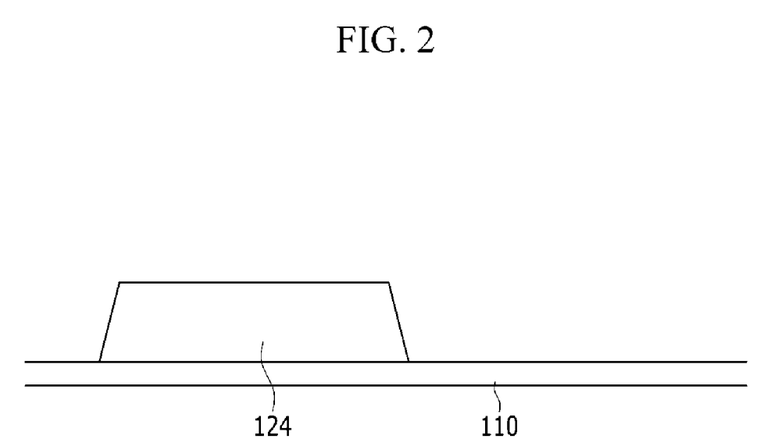
FIGS. 2 to 7 are cross-sectional views illustrating an exemplary embodiment of a process of manufacturing a thin film transistor display panel according to the invention.

First, as illustrated in FIG. 2, the gate electrode 124 is formed (e.g., provided) by forming a first metal layer on the substrate 110 which includes glass, plastic or the like, and patterning the first metal layer.

The gate electrode 124 may include a low resistance metal material such as copper (Cu). The gate electrode 124 is relatively thickly formed to have a thickness equal to or greater than about 0.7 μm so that an electrical resistance thereof may be reduced. A side surface of the gate electrode 124 may form an angle equal to or greater than about 60° with respect to an upper surface of the substrate 110. That is, the gate electrode 124 may be formed to have a tapered angle equal to or greater than about 60°.

Although not illustrated, a gate line that is connected to the gate electrode 124 may also be formed when the gate electrode 124 is formed. The gate line may include the same material as the gate electrode 124, and be in a same layer of the thin film transistor display panel as the gate electrode 124.

Figure 3:
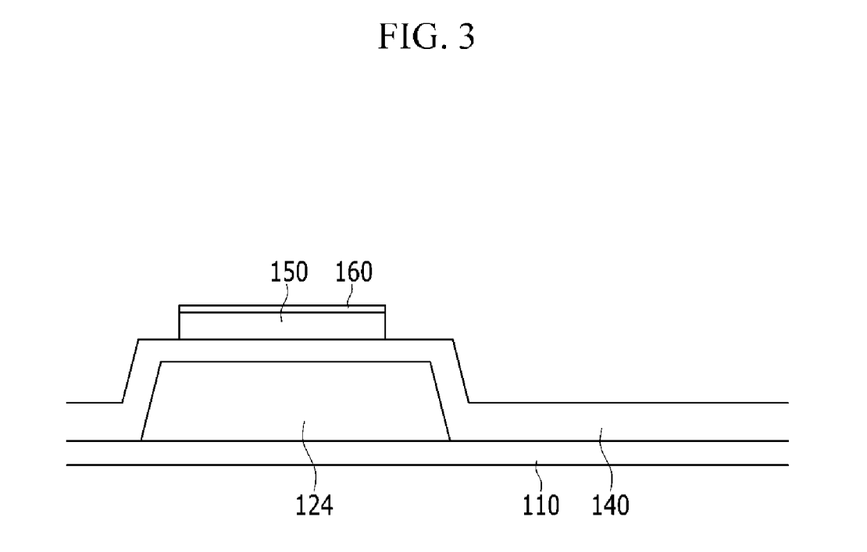

As illustrated in FIG. 3, the gate insulating layer 140 is formed on the substrate 110 and the gate electrode 124.

The gate insulating layer 140 is formed on a whole surface of the substrate 110 including the gate electrode 124 thereon. The gate insulating layer 140 may be formed by depositing an inorganic insulation material such as silicon nitride (SiNx) or silicon oxide (SiOx), on the substrate 110 including the gate electrode 124. A portion of the gate insulating layer 140 is formed directly on the substrate 110, but the invention is not limited thereto or thereby.

Next, the semiconductor layer 150 is formed on the gate insulating layer 140. The semiconductor layer 150 is formed to overlap the gate electrode 124. As illustrated, an entirety of the semiconductor layer 150 may be formed to overlap the gate electrode 124, but alternatively, only a portion of the semiconductor layer 150 may be formed to overlap the gate electrode 124.

The semiconductor layer 150 may include an amorphous silicon semiconductor, a polycrystalline silicon semiconductor, an oxide semiconductor or the like. Where the semiconductor layer 150 includes an oxide semiconductor, a material such as IGZO, ZTO, IZO or ITO may be used.

Next, the ohmic contact layer 160 may be further formed on the semiconductor layer 150. Materials for forming the ohmic contact layer 160 and the semiconductor layer 150 may be simultaneously patterned, to form the ohmic contact layer 160 and the semiconductor layer 150. Therefore, the semiconductor layer 150 and the ohmic contact layer 160 have substantially the same pattern, e.g., dimension or shape in the plan view.

Figure 4:
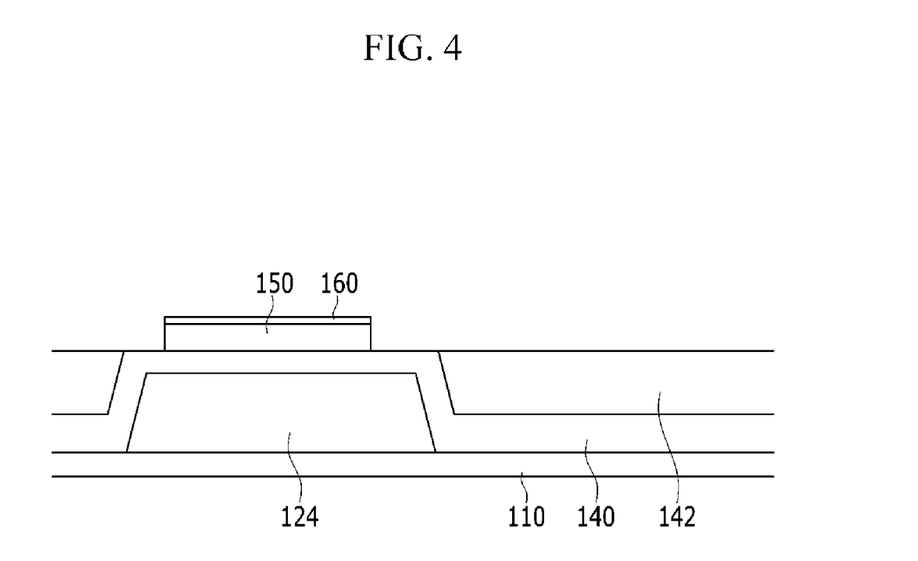

As illustrated in FIG. 4, the planarization layer 142 is formed on the gate insulating layer 140. A layer including an organic material is formed on the whole surface of the substrate 110, and the planarization layer 142 may be patterned by radiating light to a rear surface of the substrate 110. Where light is irradiated to the rear surface of the substrate 110, the gate electrode 124 serves as a mask.

The planarization layer 142 is positioned at both of opposing sides of the gate electrode 124. That is, the planarization layer 142 is formed so as not overlapped the gate electrode 124, and thus a step formed by the gate electrode 124 protruding from the substrate 110 may be removed.

The planarization layer 142 may include an organic insulation material. The upper surface of the planarization layer 142 is formed to be level with the upper surface of the gate insulating layer 140 positioned on the gate electrode 124. Therefore, a thickness of a portion of the thin film transistor display panel where the gate electrode 124 and the gate insulating layer 140 overlap each other is substantially equal to a thickness of a portion where the gate insulating layer 140 and the planarization layer 142 overlap each other. That is, a thickness of the planarization layer 142 is substantially equal to a thickness of the gate electrode 124, such that a difference between a height of the planarization layer 142 and a height of the gate electrode 124 may be equal to or less than about 0.5 μm.

While the above description includes the planarization layer 142 formed by a rear surface exposure method, the invention is not limited thereto, and the planarization layer 142 may be formed by various methods. In one exemplary embodiment, for example, an inkjet method may be used. Where the inkjet method is used to form the planarization layer 142, the gate electrode 124 serves as a partition wall to define areas for depositing material for forming the planarization layer 142.

In the illustrated exemplary embodiment of the invention, the gate insulating layer 140 is formed first and then the planarization layer 142 is formed. As a result, damage to the planarization layer 142 that may be caused by a process of forming the gate insulating layer 140 may be reduced or effectively prevented. Where the planarization layer 142 is formed before the gate insulating layer 140, since the gate insulating layer 140 is generally formed during a high temperature process, a crack may be generated in the planarization layer 142 and the gate insulating layer 140. However, since the exemplary embodiment of the invention forms the planarization layer 142 after forming the gate insulating layer 140, the problem of the crack may be reduced or effectively prevented.

Further, since ohmic contact layer is between the semiconductor layer 150 and the planarization layer, and therefore the planarization layer 142 is not formed directly on the semiconductor layer 150, contamination of the semiconductor layer 150 by the planarization layer 142 may be reduced or effectively prevented.

However, since the planarization layer 142 is formed directly on the ohmic contact layer 160, there is a concern that an ohmic contact property deteriorates. In an exemplary embodiment of the invention, the planarization layer 142 is cleaned by hydrofluoric acid ("HF") solution after being patterned, to remove a combined substance of the ohmic contact layer 160 and the planarization layer 142. Since the combined substance of the ohmic contact layer 160 and the planarization layer 142 is removed in the cleaning process, deterioration of properties of the ohmic contact layer 160 is reduced or effectively prevented.

Further, while the above description includes the entire or only a portion of the semiconductor layer 150 is formed to overlap the gate electrode 124, in one exemplary embodiment the entire semiconductor layer 150 is formed to overlap the gate electrode 124 so that the semiconductor layer 150 is not influenced by the planarization layer 142.

Figure 5:
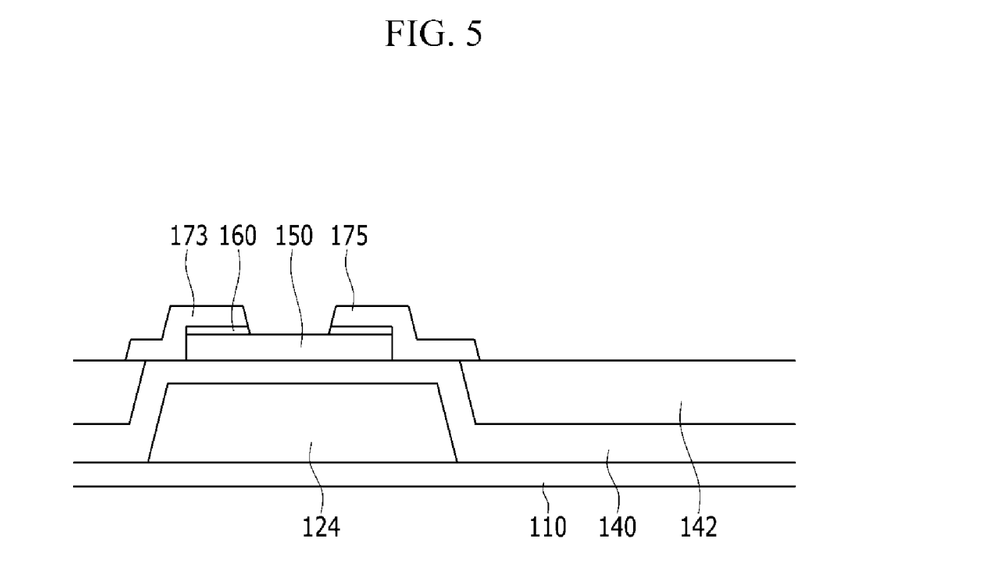

As illustrated in FIG. 5, a second metal layer is formed on substantially the whole surface of the substrate 110 including the semiconductor layer 150, the gate insulating layer 140 and the planarization layer 142, and then the source electrode 173 and the drain electrode 175 are formed to be spaced apart from each other on the semiconductor layer 150 by patterning the second metal layer.

A first portion of the source electrode 173 and a first portion of the drain electrode 175 are formed on the semiconductor layer 150, a second portion thereof is formed directly on the gate insulating layer 140, and a third portion thereof may be formed directly on the planarization layer 142. However, where the semiconductor layer 150 has a width greater than that illustrated in FIG. 5, the source electrode 173 and the drain electrode 175 may not be formed directly on the gate insulating layer 140. The source electrode 173 and the drain electrode 175 may include a low resistance metal material.

In the process of forming the source electrode 173 and the drain electrode 175, the ohmic contact layer 160 may also be patterned. Since the source electrode 173 and the drain electrode 175 are formed to be spaced apart from each other on the semiconductor layer 150, a portion of the ohmic contact layer 160 is exposed between the source electrode 173 and the drain electrode 175. In patterning the ohmic contact layer 160, the exposed portion of the ohmic contact layer 160 is removed to expose a portion of the semiconductor layer 150 between the source electrode 173 and the drain electrode 175. The exposed portion of the semiconductor layer 150 forms the channel of a thin film transistor.

Further, although not illustrated, in the process of forming the source electrode 173 and the drain electrode 175, the data line, which is connected to the source electrode 173, may also be formed. The data line may include the same material as the source electrode 173 and/or the drain electrode 175, and be in a same layer of the thin film transistor display panel as the source electrode 173 and/or the drain electrode 175, respectively.

Figure 6:
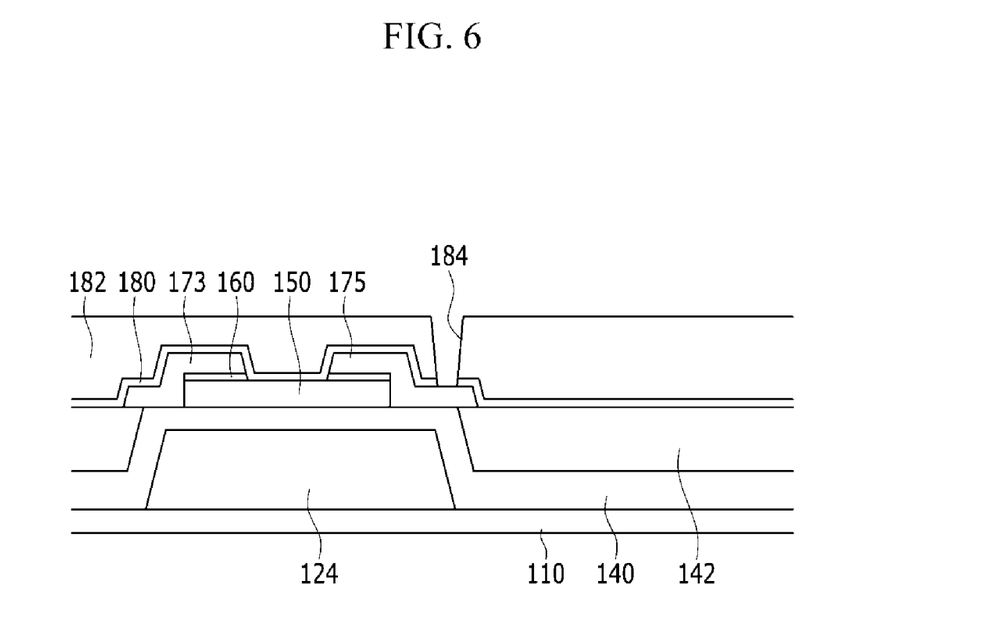

As illustrated in FIG. 6, the passivation film 180 is formed on the whole surface of the substrate 110 including the semiconductor layer 150, the source electrode 173, the drain electrode 175 and the planarization layer 142. The passivation film 180 is formed by depositing an inorganic insulation material such as silicon nitride (SiNx) or silicon oxide (SiOx).

Next, the organic film 182 may be further formed on the passivation film 180. The organic film 182 may include an organic insulation material.

Next, a contact hole 184 is defined by patterning the organic film 182 and the passivation film 180 so that an upper surface of the drain electrode 175 is exposed.

Figure 7:
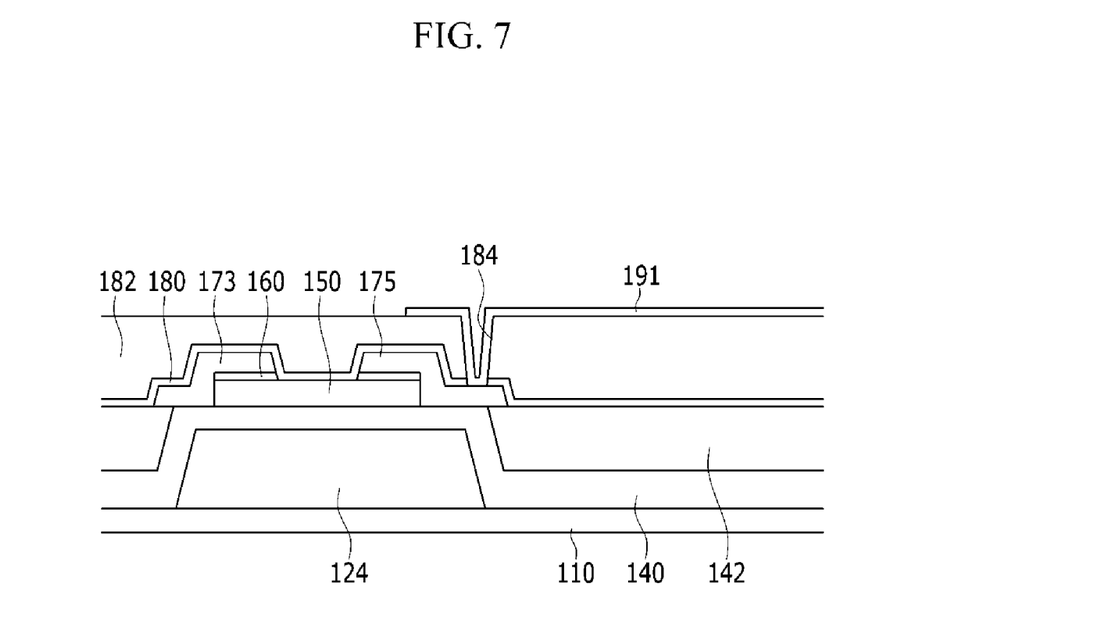

As illustrated in FIG. 7, the pixel electrode 191 is formed by forming a transparent metal material such as ITO or IZO on the organic film 182 and patterning the transparent metal material. The pixel electrode 191 is connected to the drain electrode 175 through the contact hole 184.

The gate electrode 124, the semiconductor layer 150, the source electrode 173 and the drain electrode 175, which are sequentially formed, form a single thin film transistor.

As described above, the exemplary embodiment of the thin film transistor display panel according to the invention includes the gate insulating layer 140 which is formed of silicon oxide (SiOx) having the same or similar refractive index as the substrate 110 and the organic film 182.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor display panel, comprising:
a gate electrode on a substrate;
a gate insulating layer on the substrate and the gate electrode;
a planarization layer on the gate insulating layer and at opposing sides of the gate electrode;
a semiconductor layer on the gate insulating layer; and
a source electrode and a drain electrode on the semiconductor layer and spaced apart from each other,
wherein
upper surfaces furthest from the substrate among surfaces of the gate insulating layer and the planarization layer are coplanar with each other,
first portions of the source electrode and the drain electrode are directly on the coplanar upper surface of the gate insulating layer, and
second portions of the source electrode and the drain electrode are directly on the coplanar upper surface of the planarization layer.

2. The thin film transistor display panel of claim 1, wherein:
the planarization layer exposes the gate insulating layer,
the gate insulating layer is on a whole surface of the substrate, and
a portion of the gate insulating layer is directly on the substrate.

3. The thin film transistor display panel of claim 2, wherein:
the gate electrode comprises copper, and
the gate insulating layer comprises an inorganic insulation material.

4. The thin film transistor display panel of claim 3, wherein:
the gate insulating layer comprises silicon oxide.

5. The thin film transistor display panel of claim 1, wherein:
a thickness of the gate electrode is equal to or greater than about 0.7 micrometer.

6. The thin film transistor display panel of claim 1, wherein:
a difference between a height of the gate electrode and a height of the planarization layer taken from an upper surface of the substrate, is equal to or less than about 0.5 micrometer.

7. The thin film transistor display panel of claim 6, wherein:
a thickness of the gate electrode is equal to or greater than about 0.7 micrometer.

8. The thin film transistor display panel of claim 1, wherein:
a side surface of the gate electrode forms an angle equal to or greater than about 60° with respect to an upper surface of the substrate.

9. The thin film transistor display panel of claim 1, further comprising:
   an ohmic contact layer between the semiconductor layer and the source electrode and between the semiconductor layer and the drain electrode;
   a passivation film on the semiconductor layer, the source electrode and the drain electrode;
   an organic film on the passivation film;
   a contact hole defined in the passivation film and the organic film, and exposing the drain electrode; and
   a pixel electrode on the organic film and connected to the drain electrode through the contact hole.

* * * * *